(12) United States Patent
Chino et al.

(10) Patent No.: US 10,864,698 B2
(45) Date of Patent: Dec. 15, 2020

(54) TREATED LIQUID CRYSTAL POLYMER RESIN SHEET AND RESIN MULTILAYER SUBSTRATE

(71) Applicant: Murata Manufacturing Co., Ltd., Nagaokakyo (JP)

(72) Inventors: Syota Chino, Nagaokakyo (JP); Hiroyuki Ohata, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 212 days.

(21) Appl. No.: 15/907,355

(22) Filed: Feb. 28, 2018

(65) Prior Publication Data

US 2018/0186115 A1 Jul. 5, 2018

Related U.S. Application Data

(63) Continuation of application No. PCT/JP2016/074613, filed on Aug. 24, 2016.

(30) Foreign Application Priority Data

Sep. 11, 2015 (JP) .................... 2015-179609

(51) Int. Cl.
*B32B 3/26* (2006.01)
*B32B 3/30* (2006.01)
(Continued)

(52) U.S. Cl.
CPC .............. *B32B 3/263* (2013.01); *B29C 43/18* (2013.01); *B29C 59/16* (2013.01); *B29C 65/02* (2013.01); *B29C 66/0246* (2013.01); *B29C 66/1122* (2013.01); *B29C 66/3034* (2013.01); *B29C 66/45* (2013.01); *B29C 66/721* (2013.01);
(Continued)

(58) Field of Classification Search
CPC ..... Y10T 428/24479; Y10T 428/24562; Y10T 428/24612; Y10T 428/2462; H05K 3/46; H05K 3/4635; B32B 3/263; B32B 27/08; B32B 27/20; B32B 3/30; B32B 27/02
See application file for complete search history.

(56) References Cited

U.S. PATENT DOCUMENTS 6,174,589 B1 * 1/2001 Kawakita ............. H05K 1/0373
174/258
2006/0113284 A1 6/2006 Umetsu
(Continued)

FOREIGN PATENT DOCUMENTS

JP 2004-356588 A 12/2004
JP 2006-135090 A 5/2006
(Continued)

OTHER PUBLICATIONS

Official Communication issued in International Patent Application No. PCT/JP2016/074613, dated Nov. 15, 2016.

*Primary Examiner* — Joanna Pleszczynska
(74) *Attorney, Agent, or Firm* — Keating & Bennett, LLP

(57) ABSTRACT

A treated liquid crystal polymer resin sheet includes a main surface, a non-fiberized portion in which fibrous crystalline portions and a non-crystalline portion filling a gap between the crystalline portions are provided, and a fiberized portion in which the fibrous crystalline portions is exposed at the main surface with a gap between the crystalline portions that is unfilled.

2 Claims, 6 Drawing Sheets

(51) Int. Cl.
    *B32B 27/02*    (2006.01)
    *B32B 27/08*    (2006.01)
    *B32B 27/20*    (2006.01)
    *B29C 65/02*    (2006.01)
    *B32B 27/00*    (2006.01)
    *H05K 3/46*     (2006.01)
    *B29C 65/00*    (2006.01)
    *B29C 43/18*    (2006.01)
    *B29C 59/16*    (2006.01)
    *B32B 37/06*    (2006.01)
    *C08J 5/12*     (2006.01)
    *B29C 65/78*    (2006.01)
    *B29L 9/00*     (2006.01)

(52) U.S. Cl.
    CPC ............. *B32B 27/00* (2013.01); *B32B 27/08* (2013.01); *B32B 27/20* (2013.01); *B32B 37/065* (2013.01); *C08J 5/121* (2013.01); *H05K 3/4635* (2013.01); *B29C 65/7832* (2013.01); *B29C 2791/009* (2013.01); *B29K 2995/004* (2013.01); *B29L 2009/00* (2013.01); *B32B 2307/704* (2013.01); *B32B 2398/00* (2013.01); *C08J 2300/20* (2013.01); *H05K 2201/0141* (2013.01); *H05K 2203/107* (2013.01)

(56) References Cited

U.S. PATENT DOCUMENTS

| 2008/0052904 A1* | 3/2008 | Schneider | H01L 21/486 |
| | | | 29/846 |
| 2012/0181074 A1 | 7/2012 | Ishihara et al. | |
| 2015/0230335 A1* | 8/2015 | Lee | H05K 1/0373 |
| | | | 428/213 |
| 2015/0367538 A1 | 12/2015 | Mochizuki | |

FOREIGN PATENT DOCUMENTS

| JP | 2007-088288 A | 4/2007 |
| JP | 2008-103559 A | 5/2008 |
| JP | 2010-258415 A | 11/2010 |
| JP | 2012-146983 A | 8/2012 |
| JP | 2015-091642 A | 5/2015 |

* cited by examiner

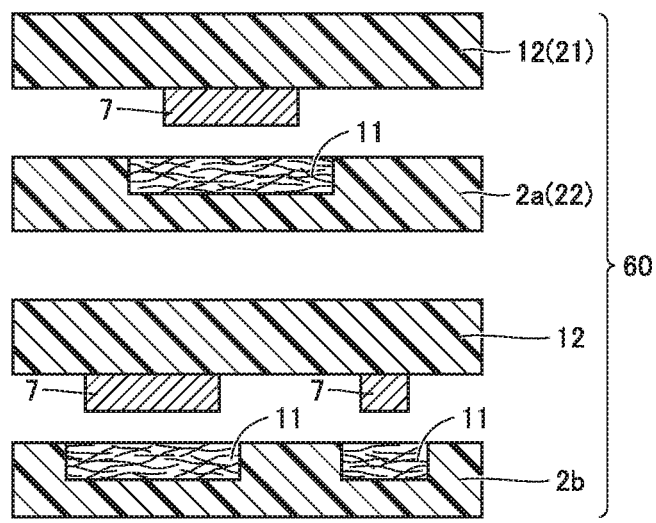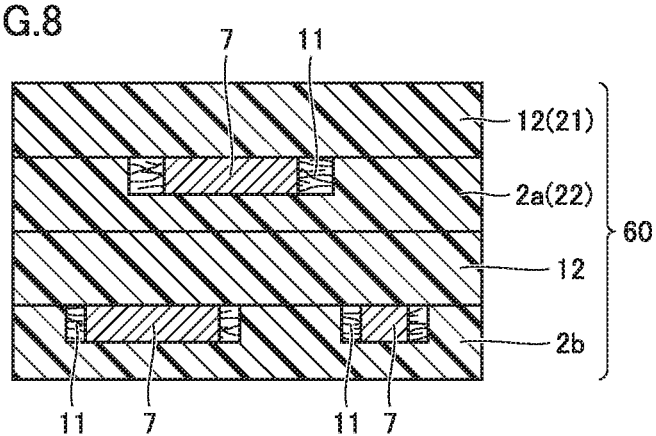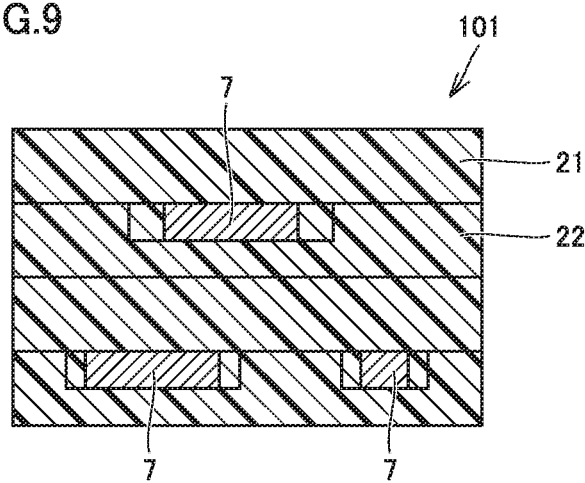

TREATED LIQUID CRYSTAL POLYMER RESIN SHEET AND RESIN MULTILAYER SUBSTRATE

CROSS REFERENCE TO RELATED APPLICATIONS

This application claims the benefit of priority to Japanese Patent Application No. 2015-179609 filed on Sep. 11, 2015 and is a Continuation Application of PCT Application No. PCT/JP2016/074613 filed on Aug. 24, 2016. The entire contents of each application are hereby incorporated herein by reference.

BACKGROUND OF THE INVENTION

1. Field of the Invention

The present invention relates to a treated liquid crystal polymer resin sheet and a method for manufacturing the same, and a resin multilayer substrate and a method for manufacturing the same.

2. Description of the Related Art

A method for manufacturing an electronic circuit substrate by stacking and thermocompression-bonding liquid crystal polymer films together is described in Japanese Patent Laying-Open No. 2008-103559, which describes applying a plasma treatment to one or opposite surfaces of each liquid crystal polymer film.

Japanese Patent Laying-Open No. 2015-091642 describes a resin molded product containing an inorganic filler and having a groove with the inorganic filler exposed.

In Japanese Patent Laying-Open No. 2008-103559, while the plasma treatment is performed to enhance adhesion between layers of the liquid crystal polymer film, it is not able to impart other functions, such as changing a shape, for example.

In Japanese Patent Laying-Open No. 2015-091642, while it is necessary to include the inorganic filler in the resin beforehand, including an inorganic filler, such as glass fiber, impairs the resin molded product in flexibility. It is difficult to perform the technique of Japanese Patent Laying-Open No. 2015-091642 with a flexible film that defines a base.

SUMMARY OF THE INVENTION

Preferred embodiments of the present invention provide treated liquid crystal polymer resin sheets capable of providing a desired function to a flexible film in a desired region and methods for manufacturing the same, and resin multilayer substrates and methods for manufacturing the same.

A treated liquid crystal polymer resin sheet according to a preferred embodiment of the present invention includes a main surface, a non-fiberized portion in which fibrous crystalline portions and a non-crystalline portion filling a gap between the crystalline portions are provided, and a fiberized portion in which fibrous crystalline portions are exposed at the main surface with a gap between the crystalline portions that is unfilled.

According to preferred embodiments of the present invention, the treated liquid crystal polymer resin sheets have flexibility and include a non-fiberized portion and a fiberized portion, and are thus able to provide a flexible film with a desired function in a desired region.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 7 illustrates a first step of the method for manufacturing the resin multilayer substrate according to the third preferred embodiment of the present invention.

FIG. 8 illustrates a second step of the method for manufacturing the resin multilayer substrate according to the third preferred embodiment of the present invention.

FIG. 9 is a cross section of a resin multilayer substrate obtained in the method for manufacturing the resin multilayer substrate according to the third preferred embodiment of the present invention.

DETAILED DESCRIPTION OF THE PREFERRED EMBODIMENTS

The figures show a dimensional ratio, which is not necessarily representative of reality, and may be exaggerated for convenience of illustration. In the following description, when referring to a concept of being upper or lower, it does not mean being absolutely upper or lower and, instead, means being relatively upper or lower in a position shown in a figure.

First Preferred Embodiment

Figure 1:
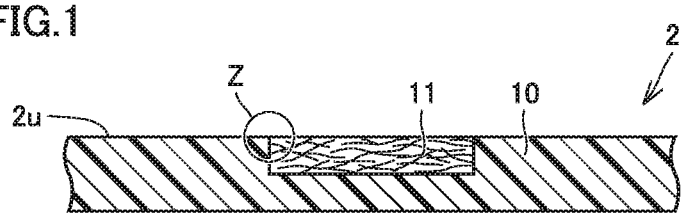
FIG. 1 is a cross section of a treated liquid crystal polymer resin sheet according to a first preferred embodiment of the present invention.
Figure 2:
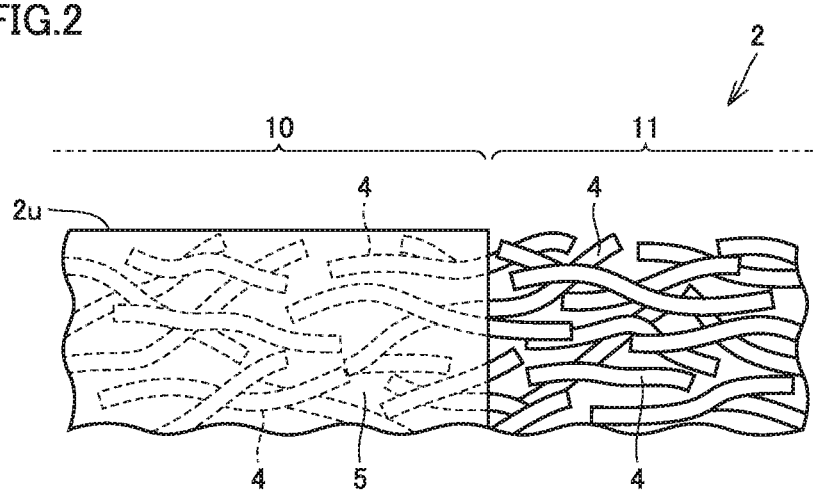
FIG. 2 is an enlarged view of a portion Z in FIG. 1.

With reference to FIG. 1 and FIG. 2, a treated liquid crystal polymer resin sheet according to a first preferred embodiment of the present invention will be described. An example of a treated liquid crystal polymer resin sheet 2 in the present preferred embodiment is shown in FIG. 1. FIG. 2 shows an enlarged view of a portion Z shown in FIG. 1. Treated liquid crystal polymer resin sheet 2 includes a main surface 2u, a non-fiberized portion 10 in which fibrous crystalline portions 4 and a non-crystalline portion 5 filling a gap between the crystalline portions 4 are provided, and a fiberized portion 11 in which fibrous crystalline portions 4 are exposed at main surface 2u with a gap between the crystalline portions being unfilled.

Although fibrous crystalline portions 4 and non-crystalline portion 5 filling a gap between fibrous crystalline portions 4 are both made of a liquid crystal polymer resin, they are different in whether they are in a crystalline state. When the gap between crystalline portions 4 is filled with non-crystalline portion 5, portions 4 and 5 have a substantially invisible boundary therebetween, if any, and accordingly, FIG. 2 shows non-fiberized portion 10 with the boundary considered to potentially exist, and accordingly, indicated by a broken line. While FIG. 2 schematically shows crystalline portions 4 as short fibers having a fixed thickness, and fiberized portion 11 having a large number of such crystalline portions 4 entangled together, crystalline portions 4 as fibers do not necessarily have a fixed thickness. Furthermore, crystalline portions 4 as fibers do not necessarily have a length as shown, either. Furthermore, how crystalline portions 4 are entangled together is also schematically shown in FIG. 2, and in reality, they may be entangled together more complexly.

Treated liquid crystal polymer resin sheet 2 in the present preferred embodiment is preferably primarily made of a liquid crystal polymer resin, and thus has flexibility. Treated liquid crystal polymer resin sheet 2 includes non-fiberized portion 10 and fiberized portion 11, and accordingly, is able to, for example, provide a flexible film with a desired function in a desired region, as will be described hereinafter.

How treated liquid crystal polymer resin sheet 2 having such a structure is manufactured will be described in detail with reference to a second preferred embodiment of the present invention.

Note that, for example, when a specific powdery matter is caused to adhere to a sheet to provide a desired function, the powdery matter is preferably sprinkled on treated liquid crystal polymer resin sheet 2 and then removed so that in non-fiberized portion 10, the powdery matter falls off, whereas in fiberized portion 11, the powdery matter is affixed on a fibrous, exposed crystalline portion. Such a treatment enables a function to be selectively provided to a desired region on the sheet.

Furthermore, another usage is also considered, as follows. Fiberized portion 11 has an increased surface area, and accordingly, an electroless copper plating catalyst represented by palladium easily adheres thereto. Electroless copper plating progresses as copper ions are reduced on the catalyst, and accordingly, in fiberized portion 11 copper plating is grown significantly faster than at a portion which is non-fiberized. Accordingly, by forming fiberized portion 11 in a desired pattern, a conductor pattern formed by plating is able to be grown only in a region of a desired shape.

Furthermore, another usage is also considered, as follows. Treated liquid crystal polymer resin sheet 2 preferably includes fiberized portion 11 with a cushioning property, and when the sheet is used with fiberized portion 11 exposed at a surface, it provides the cushioning property to a desired portion of the surface.

Second Preferred Embodiment

Figure 3:
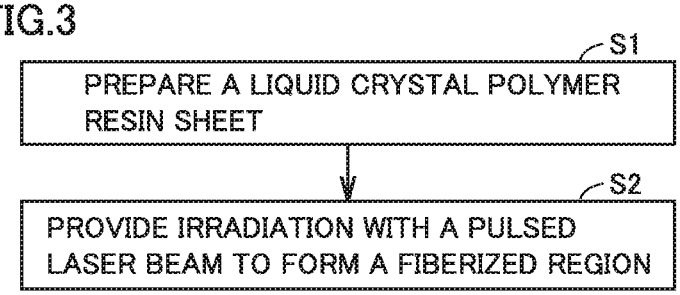
FIG. 3 is a flowchart of a method for manufacturing a treated liquid crystal polymer resin sheet according to a second preferred embodiment of the present invention.
Figure 4:
FIG. 4 illustrates a first step of the method for manufacturing the treated liquid crystal polymer resin sheet according to the second preferred embodiment of the present invention.
Figure 5:
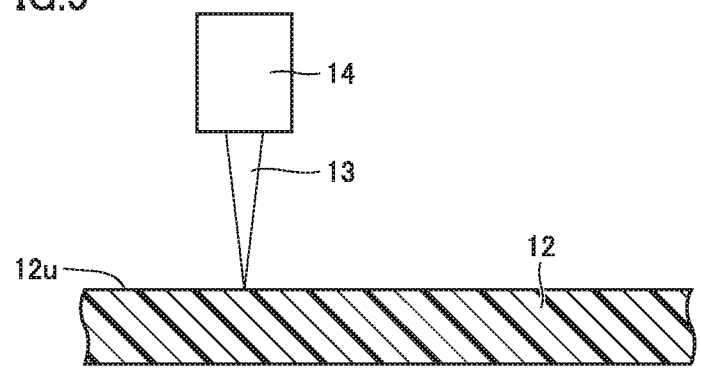
FIG. 5 illustrates a second step of the method for manufacturing the treated liquid crystal polymer resin sheet according to the second preferred embodiment of the present invention.

With reference to FIG. 3 to FIG. 5, a method for manufacturing a treated liquid crystal polymer resin sheet according to a second preferred embodiment of the present invention will be described. FIG. 3 is a flowchart of the method for manufacturing a treated liquid crystal polymer resin sheet according to the present preferred embodiment.

The method for manufacturing a treated liquid crystal polymer resin sheet according to the present preferred embodiment includes a step S1 of preparing a liquid crystal polymer resin sheet including a main surface in which fibrous crystalline portions and a non-crystalline portion filling a gap between the crystalline portions are provided, and a step S2 of irradiating the main surface with a pulsed laser beam locally to form a fiberized portion in a partial region of the main surface with the fibrous crystalline portions exposed with a gap therebetween that is unfilled.

Each step will be described more specifically. As step S1, as shown in FIG. 4, a liquid crystal polymer resin sheet 12 is prepared. As liquid crystal polymer resin sheet 12, a sheet is used which includes main surface 12u in which fibrous crystalline portions and a non-crystalline portion filling a gap between the crystalline portions are provided. The crystalline and non-crystalline portions have a boundary, which, however, is substantially not distinctively observed, and accordingly, FIG. 4 shows them as one simple sheet. Normally, commercially available liquid crystal polymer resin sheets already satisfy such a condition.

In step S2, as shown in FIG. 5, the main surface 12u of liquid crystal polymer resin sheet 12 is locally irradiated with a pulsed laser beam 13. Pulsed laser beam 13 is emitted from a laser beam emission device 14. Pulsed laser beam 13 is emitted to scan only a desired region of main surface 12u. Pulsed laser beam 13 may preferably be emitted, for example, with an energy density of about 3 J/cm$^2$ or more and about 35 J/cm$^2$ or less. Pulsed laser beam 13 may preferably be emitted, for example, at intervals of about 20% or more and about 80% or less of its spot diameter with equal or substantially equal pitches. Pulsed laser beam 13 may preferably have, for example, a frequency of about 10 kHz or more and about 1000 kHz or less. Irradiating a partial region of main surface 12u with pulsed laser beam 13 forms a fiberized portion in the region with fibrous crystalline portions exposed with a gap therebetween that is unfilled.

Some sheets of liquid crystal polymer resin include a crystalline portion and a non-crystalline portion. While the portions are identical or substantially identical in material, they internally have different crystal structures. This difference in structure provides different melting points. The crystalline portion has a higher melting point than the non-crystalline portion. By irradiating such a sheet with pulsed laser beam 13, the non-crystalline portion having a low melting point is selectively vaporized, and the crystalline portion having a high melting point remains. The crystalline portion is fibrous, and accordingly, a region in which the crystalline portion alone remains will be a fiberized portion. As a result, as shown in FIG. 1 and FIG. 2, fiberized portion 11 is formed.

The method for manufacturing a treated liquid crystal polymer resin sheet according to the present preferred embodiment is able to provide a flexible film with a desired function in a desired region.

In general, an operation of irradiating a material with a laser beam is used for cutting or surface modification. When the operation is laser irradiation for cutting, the laser beam would penetrate the material. In contrast, when the operation is laser irradiation for surface modification, the material is not removed and only a state of a surface is changed. For example, only a crystal structure is changed in the surface and therearound. In contrast, in the present preferred embodiment, the operation is not intended to remove the material entirely, but rather, it is intended to remove a portion of the material other than a specific structure mixed in the material.

This method enables a fiberized portion to be partially formed in a sheet of a single material i.e., liquid crystal polymer resin. The method also enables a fiberized portion to be partially formed in a flexible thin sheet. In the fiberized portion the material has a reduced density.

Third Preferred Embodiment

Figure 6:
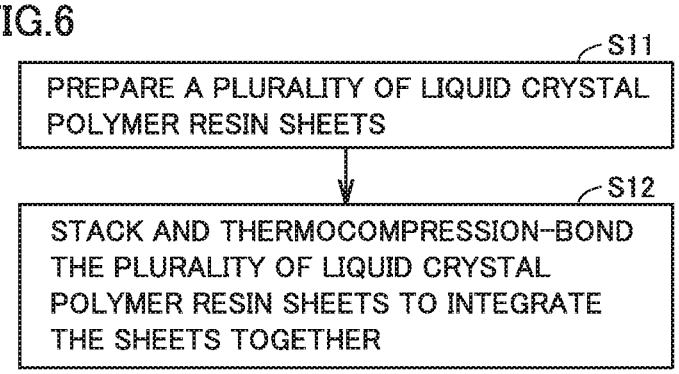
FIG. 6 is a flowchart of a method for manufacturing a resin multilayer substrate according to a third preferred embodiment of the present invention.

With reference to FIG. 6 to FIG. 9, a method for manufacturing a resin multilayer substrate according to a third preferred embodiment of the present invention will be described. A flowchart of the method for manufacturing the resin multilayer substrate according to the present preferred embodiment is shown in FIG. 6. The method for manufacturing the resin multilayer substrate according to the present preferred embodiment includes a step S11 of preparing a plurality of liquid crystal polymer resin sheets including the treated liquid crystal polymer resin sheet described in the first preferred embodiment, and a step S12 of stacking and thermocompression-bonding the plurality of liquid crystal polymer resin sheets to integrate the sheets together.

Hereinafter, each step will be described more specifically. As step S11, for example as shown in FIG. 7, a plurality of liquid crystal polymer resin sheets 60 are prepared. The plurality of liquid crystal polymer resin sheets 60 include treated liquid crystal polymer resin sheets 2a and 2b as the treated liquid crystal polymer resin sheet described in the first preferred embodiment. The plurality of liquid crystal polymer resin sheets 60 further include liquid crystal polymer resin sheet 12 that do not include the fiberized portion formed therein. The combination of the plurality of liquid crystal polymer resin sheets 60 indicated herein is merely an example and is not a limitation. The plurality of liquid crystal polymer resin sheets 60 may all be the treated liquid crystal polymer resin sheet including the fiberized portion formed therein.

As step S12, as shown in FIG. 8, the plurality of liquid crystal polymer resin sheets 60 are deposited in layers to form a stack. The stack is heated and compressed, that is, thermocompression-bonded, and thus integrated together. A resin multilayer substrate 101 as shown in FIG. 9 is thus obtained. While FIGS. 7 to 9 show four liquid crystal polymer resin sheets 60, this is only one preferred example, and the number of sheets is not limited to four.

Further, preferably, in the present preferred embodiment, as shown in FIG. 7, the plurality of liquid crystal polymer resin sheets include a first sheet 21 including a conductor portion 7 so as to locally cover a surface and a second sheet 22 including fiberized portion 11. Conductor portion 7 may preferably be a conductor pattern formed on a surface of a resin sheet by a conductive foil or other suitable material, for example. Conductor portion 7 may be a metal film. Conductor portion 7 may be a copper foil formed in a desired shape. While fiberized portion 11 may preferably be provided in the main surface of second sheet 22 at a plurality of locations, fiberized portion 11 is herein simply shown at one location for convenience of illustration. In step S12 of stacking (see FIG. 6), first sheet 21 and second sheet 22 are superposed on each other such that conductor portion 7 directly overlaps fiberized portion 11. By being superposed, as shown in FIG. 8, conductor portion 7 compresses a portion of fiberized portion 11 and enters a portion of a space which was previously fiberized portion 11. In other words, a difference in level due to conductor portion 7 is absorbed by fiberized portion 11. When a positional error is considered, it is preferable to design fiberized portion 11 to be slightly wider than conductor portion 7, and in that case, as shown in FIG. 8, even after conductor portion 7 is absorbed in fiberized portion 11, at a portion of an end of fiberized portion 11, fibrous crystalline portions 4 remain with a gap therebetween that is unfilled. After the stack is thermocompression-bonded and thus integrated, a state as shown in FIG. 9 is obtained. A portion that remains as fiberized portion 11 receives resin flowing in from around the portion during the thermocompression bonding, and fibrous crystalline portion 4 is already buried.

In the present preferred embodiment, a resin multilayer substrate is formed of a plurality of liquid crystal polymer resin sheets including the treated liquid crystal polymer resin sheet described in the first preferred embodiment, and thus, includes a fiberized portion in the stack. Thus, the resin multilayer substrate is able to be obtained while providing a desired function to a flexible film in a desired region. Herein, while, of the plurality of stacked sheets, an uppermost sheet is described as first sheet 21 and a sheet immediately thereunder is described as second sheet 22, first sheet 21 and second sheet 22 are not necessarily limited to two layers with such a position. arrangement. The stack of sheets may include first sheet 21 and second sheet 22 that are located at other positions.

Fiberized portion 11 is a portion including fibrous crystalline portion 4 that is exposed, and when a solid enters, crystalline portion 4 is easily compressed. This enables the solid to be received within a region of the fiberized portion. In the present preferred embodiment, a difference in level caused by conductor portion 7 of first sheet 21 is absorbed by fiberized portion 11 of second sheet 22, and a difference in level otherwise caused on a surface of the stack is able to be reduced or prevented. Thus, a difference in level caused on a surface of the resin multilayer substrate is able to be reduced or prevented.

Fourth Preferred Embodiment

Figure 10:
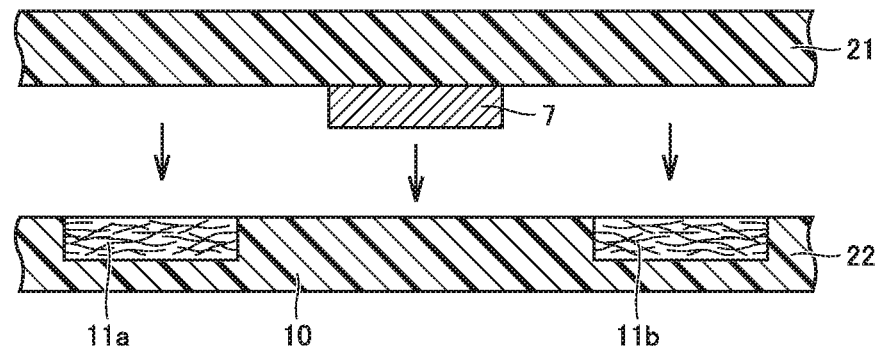
FIG. 10 illustrates a first step of a method for manufacturing a resin multilayer substrate according to a fourth preferred embodiment of the present invention.
Figure 11:
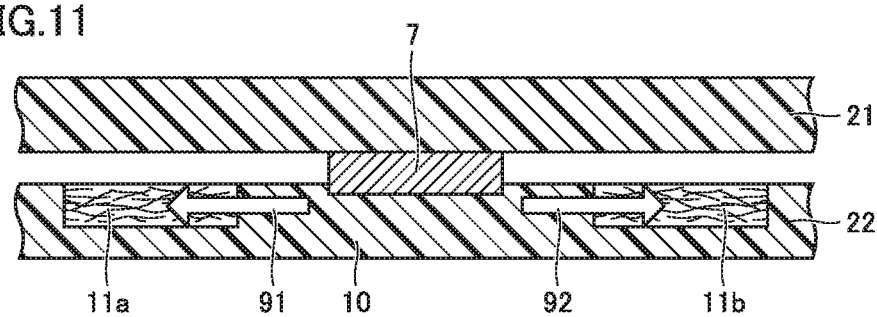
FIG. 11 illustrates a second step of the method for manufacturing the resin multilayer substrate according to the fourth preferred embodiment of the present invention.
Figure 12:
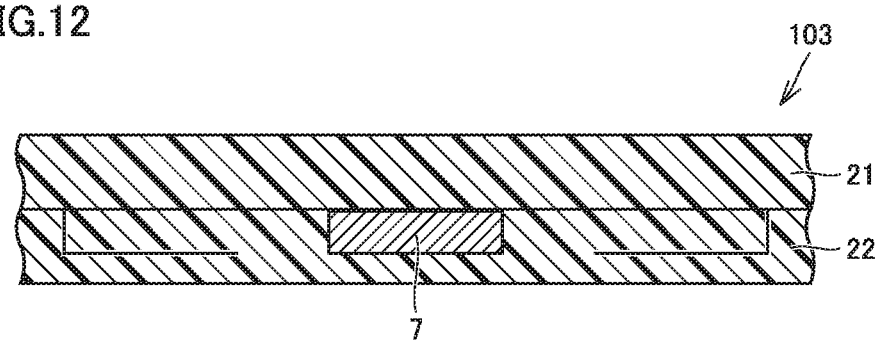
FIG. 12 is a cross section of a resin multilayer substrate obtained in the method for manufacturing the resin multilayer substrate according to the fourth preferred embodiment of the present invention.

With reference to FIG. 10 to FIG. 12, a method for manufacturing a resin multilayer substrate according to a fourth preferred embodiment of the present invention will be described. The method for manufacturing a resin multilayer substrate according to the present preferred embodiment is substantially the same as the method for manufacturing a resin multilayer substrate according to the third preferred embodiment, and accordingly, only a different portion will be described.

In the present preferred embodiment, a plurality of liquid crystal polymer resin sheets include first sheet 21 including conductor portion 7 so as to locally cover a surface and second sheet 22 including fiberized portions 11a and 11b, as shown FIG. 10. While an example is shown in which the fiberized portion is preferably provided at two locations, the fiberized portion may be provided at one location or may be provided at three or more locations. In step S12 of stacking (see FIG. 6), first sheet 21 and second sheet 22 are superposed on each other such that when they are heated and compressed with conductor portion 7 overlapping a portion of a resin, the resin flows and the flow of the resin is absorbed by fiberized portions 11a and 11b. That is, fiberized portions 11a, 11b are disposed within a range close to a projected area of conductor portion 7 to such an extent that the flow of the resin caused as conductor portion 7 overlaps second sheet 22 reaches fiberized portions 11a, 11b. Fiberized portions 11a, 11b may partially overlap the projected area of conductor portion 7. In the example shown in FIG. 10, fiberized portions 11a, 11b are preferably disposed at a position different than the projected area of conductor portion 7.

In step S12 of stacking (see FIG. 6), when conductor portion 7 overlaps a portion of a resin and heat and pressure are applied for thermocompression bonding, the resin flows from conductor portion 7 radially, as shown in FIG. 11. The resin flows into fiberized portions 11a and 11b, as indicated by arrows 91 and 92. Fiberized portions 11a, 11b are portions in which fibrous crystalline portion 4 remains with a gap that is unfilled, and accordingly, have a lower density than the other portion(s). When the resin flows into fiberized portions, the resin is received in a gap between fibrous crystalline portions 4, and the resin's flow is reduced. In this manner, as shown in FIG. 12, resin multilayer substrate 103 is able to be obtained. The resin's flow is absorbed in a portion which was previously a fiberized portion, and thus, does not extend outwardly of that portion. In FIG. 12, a trace of fiberized portions 11a and 11b is schematically shown. In reality, the trace of fiberized portions 11a and 11b does not necessarily appear in the form as shown. Depending on the condition of the thermocompression bonding, such a trace of fiberized portions 11a and 11b may not remain.

In the fiberized portion, the resin flowing in the thermocompression bonding is received in a gap between fibrous crystalline portions 4, and if the fiberized portion has a sufficiently large volume, it may dam the flowing resin. As has been indicated in the present preferred embodiment, a flow of a resin is able to be reduced, prevented, or controlled by previously disposing the fiberized portion at a position which is in the path of the flow of the resin. For example, a flow of a resin spreading radially from conductor portion 7 is able to be absorbed by a fiberized portion disposed to surround conductor portion 7 in a plan view. This prevents the flow of the resin outwardly of the fiberized portion.

When it is desired to prevent the flow of the resin from having an effect in a specific region of the resin multilayer substrate, the present preferred embodiment may be applied to position the fiberized portion as appropriate.

Fifth Preferred Embodiment

Figure 13:
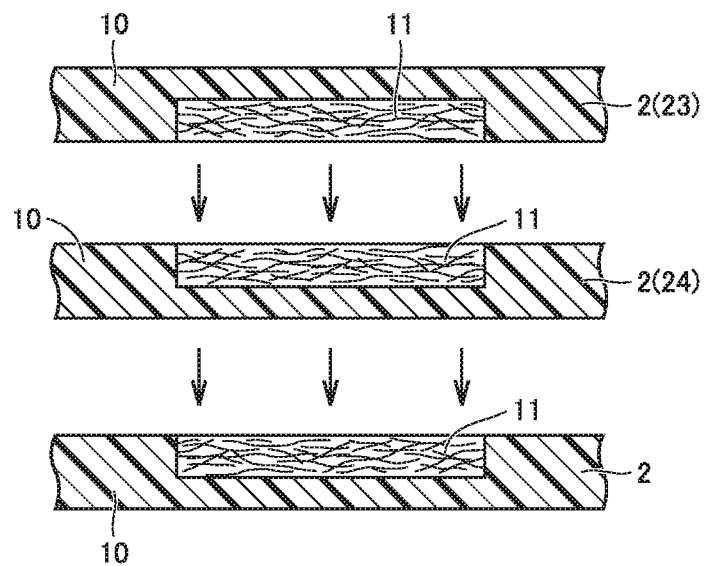
FIG. 13 illustrates a method for manufacturing a resin multilayer substrate according to a fifth preferred embodiment of the present invention.
Figure 14:
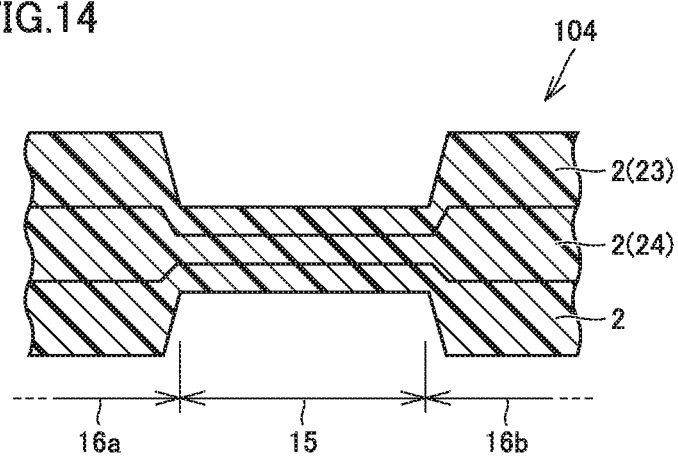
FIG. 14 is a cross section of a resin multilayer substrate obtained in the method for manufacturing the resin multilayer substrate according to the fifth preferred embodiment of the present invention.

With reference to FIG. 13 and FIG. 14, a method for manufacturing a resin multilayer substrate according to a fifth preferred embodiment of the present invention will be described. The method for manufacturing a resin multilayer substrate according to the present preferred embodiment is substantially the same as the method for manufacturing a resin multilayer substrate in the third preferred embodiment, and accordingly, only a different portion will be described.

In the present preferred embodiment, as shown in FIG. 13, a plurality of liquid crystal polymer resin sheets include an A sheet 23 and a B sheet 24 that are each a treated liquid crystal polymer resin sheet such as has been described in the first preferred embodiment. In step S12 of stacking, when seen in a plan view, A sheet 23 and B sheet 24 are superposed on each other such that at least a portion of fiberized portion 11 of A sheet 23 and at least a portion of fiberized portion 11 of B sheet 24 have a positional relationship so as to overlap each other. While the example shown in FIG. 13 shows A sheet 23 and B sheet 24 including fiberized portions 11, respectively, of the same or substantially the same size at the same or substantially the same locations, respectively, A sheet 23 and B sheet 24 do not necessarily include fiberized portions 11, respectively, of the same or substantially the same size at the same or substantially the same locations, respectively. A sheet 23 and B sheet 24 that include fiberized portions 11, respectively, that at least partially overlap each other, are sufficient.

By performing step S12 with such a condition satisfied, a portion including fiberized portions 11 overlapping each other include fiberized portions 11 that are compressed and, thus, reduced in thickness, as shown in FIG. 14. In this manner, a resin multilayer substrate 104 including a thin portion 15 and thick portions 16a, 16b is obtained. Note that A sheet 23 and B sheet may preferably include a conductor portion at any portion thereof.

In the present preferred embodiment, thin portion 15 and thick portions 16a, 16b are able to be formed in a resin multilayer substrate, and this method may be used to provide thin portion 15 and thick portion 16 defining a flexible portion and a rigid portion, respectively, in a final resin multilayer substrate.

The present preferred embodiment enables the flexible portion and the rigid portion to have a boundary which does not expose an interface of sheets. A portion with such an interface exposed would likely be a starting point of exfoliation, whereas in the present preferred embodiment, such an interface is not exposed, and a resin multilayer substrate which does not easily peel off is able to be obtained.

In the example shown in FIG. 13, not only A sheet 23 and B sheet 24, but another resin sheet also preferably includes fiberized portion 11, and step S12 is performed such that three fiberized portions 11 overlap one another. Thus, step S12 may be performed with three or more sheets provided with fiberized portions, respectively, with the fiberized portions overlapping one another. As the number of layers including fiberized portions 11 overlapping one another increases, a degree of reduction in thickness caused as fiberized portions 11 are compressed increases, and the rigid portion and the flexible portion have an increased difference in thickness.

Sixth Preferred Embodiment

Figure 15:
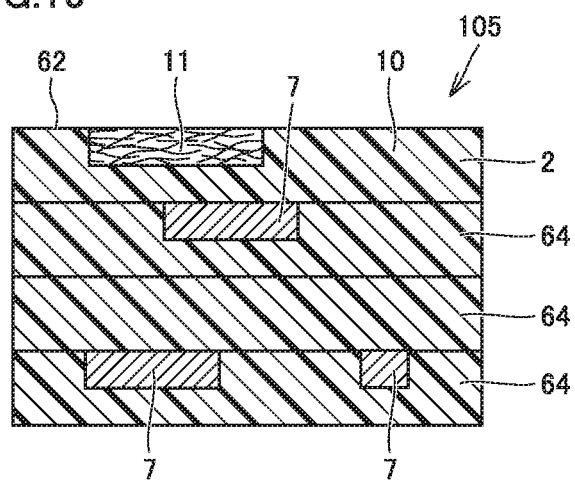
FIG. 15 is a cross section of a resin multilayer substrate according to a sixth preferred embodiment of the present invention.

With reference to FIG. 15, a method for manufacturing a resin multilayer substrate according to a sixth preferred embodiment of the present invention will be described. While in the first preferred embodiment, treated liquid crystal polymer resin sheet 2 has been described, a resin multilayer substrate may preferably include a plurality of liquid crystal polymer resin sheets including at least one treated liquid crystal polymer resin sheet 2 disposed to include fiberized portion 11 exposed at a surface of the resin multilayer substrate. For example, as shown in FIG. 15, the resin multilayer substrate may preferably be a stack of treated liquid crystal polymer resin sheet 2 and one or more liquid crystal polymer resin sheets 64. While a plurality of liquid crystal polymer resin sheets 64 are indicated, some or all of these liquid crystal polymer resin sheets 64 may be treated liquid crystal polymer resin sheet 2. Liquid crystal polymer resin sheet 64 may be a simple liquid crystal polymer resin sheet.

The sixth preferred embodiment provides a resin multilayer substrate 105 including a plurality of liquid crystal polymer resin sheets that are stacked, and thermocompression-bonded so as to be integrated together, the substrate including a main surface 62 exposed to the outside, the substrate including in main surface 62 non-fiberized portion 10 in which fibrous crystalline portions and a non-crystalline portion filling a gap between the crystalline portions are provided, and fiberized portion 11 in which the fibrous crystalline portion is exposed at the main surface with a gap between the crystalline portions that is unfilled. In the example shown in FIG. 15, several conductor portions 7 are disposed inside resin multilayer substrate 105.

According to the present preferred embodiment, the resin multilayer substrate is able to include a surface provided with a cushioning property at a desired portion. Note that in order to obtain the resin multilayer substrate according to the present preferred embodiment, a method may not be used in which each resin sheet is irradiated with a pulsed laser beam to form a fiberized portion and, subsequently, the resin sheets are stacked and integrated together. Instead, a method may be used in which the step of stacking and integrating the resin sheets together is initially performed and subsequently, a main surface exposed to the outside as a surface of the entirety is locally irradiated with a pulsed laser beam to form a fiberized portion in the main surface at desired partial region.

Note that a plurality of the above preferred embodiments may be combined as appropriate and employed.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A treated liquid crystal polymer resin sheet comprising:
a main surface;
a non-fiberized portion in which fibrous crystalline portions and a non-crystalline portion filling a gap between the fibrous crystalline portions are provided; and
a fiberized portion in which the fibrous crystalline portions are exposed at the main surface with a gap between the fibrous crystalline portions that is unfilled; wherein
the fibrous crystalline portions include liquid crystal polymer resin.

2. A resin multilayer substrate comprising:
a plurality of liquid crystal polymer resin sheets that are stacked, thermocompression-bonded, and integrated together; wherein
the resin multilayer substrate includes a main surface exposed to an outside; and
the main surface includes a non-fiberized portion in which fibrous crystalline portions and a non-crystalline portion filling a gap between the fibrous crystalline portions are provided, and a fiberized portion in which the fibrous crystalline portions are exposed at the main surface with a gap between the fibrous crystalline portions that is unfilled.

* * * * *